United States Patent [19]

Hamano

[11] Patent Number: 5,410,549

[45] Date of Patent: Apr. 25, 1995

[54] LOGIC SIMULATOR

[75] Inventor: Hiroyuki Hamano, Itami, Japan

[73] Assignee: Mitsubishi Denki Kabushiki Kaisha, Tokyo, Japan

[21] Appl. No.: 35,799

[22] Filed: Mar. 23, 1993

[30] Foreign Application Priority Data

Apr. 9, 1992 [JP] Japan .................................. 4-088472

[51] Int. Cl.⁶ .......................................... G01R 31/28
[52] U.S. Cl. .................... 371/23; 371/25.1; 324/731
[58] Field of Search .............. 371/23, 25.1; 324/73.1; 364/578–580, 488

[56] References Cited

U.S. PATENT DOCUMENTS

| | | | |
|---|---|---|---|
| 4,601,032 | 7/1986 | Robinson | 371/23 |
| 4,771,428 | 9/1988 | Acuff et al. | 371/25 |
| 4,852,093 | 7/1989 | Koeppe | 371/23 |
| 4,937,765 | 6/1990 | Shupe et al. | 371/23 |
| 5,291,495 | 3/1994 | Udell, Jr. | 371/22.3 |

Primary Examiner—Emanuel T. Voeltz
Assistant Examiner—Craig Miller
Attorney, Agent, or Firm—Oblon, Spivak, McClelland, Maier & Neustadt

[57] ABSTRACT

There is disclosed a logic simulator including a logic circuit verifying portion (3) that records in a floating information storage portion (4) generation and end times of a floating state with respect to a signal provided from a node specified by a through current verification node data (D3) as a function of a circuit connection data (D2) during the execution of a logic simulation and compares each floating node information (d13) in a floating node information group (D13) accumulated in the floating information storage portion (4) with a through current generation critical; period (D12) after the completion of the logic simulation to perform a through current generation verification, thereby achieving an automatic verification of the presence of an undesired current such as a through current generated in a logic circuit with high accuracy.

14 Claims, 8 Drawing Sheets

```
Error : floating time 180 is over the value of margin 100
#      Signal Value Is High Impedance
#      Net name    : TBCLOCK
#      Start time  : 520
#      End time    : 700
```

```
          S  S  C  A  A  A  ⎫
          I  I  L  D  D  D  ⎪
    52    G  G  K  3  2  1  ⎬ 51
        ⎴ 1  2              ⎪
       TIME                  ⎭

0    X  Z  X  X  X  X  ⎫
    12    0  Z  1  X  X  X  ⎬ 53
    15    0  0  1  1  0  1  ⎭
                     D5
```

LOGIC SIMULATOR

BACKGROUND OF THE INVENTION

1. Field of the Invention

The present invention relates to a logic simulator for verifying the presence of an undesired current generated in a logic circuit.

2. Description of the Background Art

FIG. 7 is a block diagram of a conventional logic simulator for logically verifying the operation of a logic circuit. A circuit connection data portion 7 receives a logic circuit data D1 that is drawing data of the circuit to be simulated to output a circuit connection data D2 specifying the connection of devices forming the logic circuit to a logic circuit verifying portion 6 as a function of the logic circuit data D1. A logic verification node condition portion 8 outputs to the logic circuit verifying portion 6 a logic verification node condition data D3 specifying the conditions of nodes to be logically verified among those provided between the devices specified by the circuit connection data D2.

The logic circuit verifying portion 6 carries out a logic simulation as a function of the circuit connection data D2 to output signals (logic verification signals) only provided from the nodes satisfying the conditions specified by the logic verification node condition data D3 as a logic simulation result D4 to a logic verification result output portion 9. The logic verification result output portion 9 outputs a logic simulation result list D5 in which the results are described in a list form as shown in FIG. 8 as a function of the logic simulation result D4. In FIG. 8, reference numeral 51 designates logic verification signal names; 52 designates a time change of a time unit that is a simulation execution time; and 53 designates logical results at the simulation execution time. The logical results 53 include four signals: 0, 1, X (indeterminate level) and Z (floating state).

In the conventional logic simulator formed as above-described, the logic simulation results of the signals provided from the nodes satisfying the conditions specified by the logic verification node condition data D3 are outputted finally as the logic simulation result list D5.

For detection of an abnormal current such as a through current generated in the logic circuit, it is necessary to pay attention to the floating state of the node. The only method for detecting the abnormal current such as the through current by the conventional logic simulator is to carry out the logic simulation in the logic circuit verifying portion 6, with all of the nodes between the devices specified by the circuit connection data D2 taken as logic verification target nodes, so that an expert observes the logic simulation result list D5.

However, the logic simulation result list D5 outputted as a function of the logic simulation result D4 provided that all of the nodes are the logic verification target nodes includes the logic verification results for an enormous number of signals. It is impracticable to observe such logic simulation result list D5 to detect the abnormal current such as the through current. In addition, a memory capacitance for storing the logic simulation result D4 having the enormous data is far increased.

SUMMARY OF THE INVENTION

The present invention is intended for a logic simulator for detecting the presence of an undesired current generated in a predetermined logic circuit. According to the present invention, the logic simulator comprises circuit connection data means for providing circuit connection data specifying connection of devices forming the logic circuit; means for receiving the circuit connection data and identifying an undesired current verification target node at which there is a danger of generation of the undesired current in the logic circuit in a logically unstable state out of nodes provided between the devices forming the logic circuit; and verifying means for receiving the circuit connection data and the target node for performing a logic simulation on the logic circuit and for determining an unstable state duration for which a signal provided from the target node has an unstable logical level to verify the presence of the undesired current generated in the logic circuit as a function of the unstable state duration.

The verifying means automatically determines the logically unstable state duration of the signal provided from the target node at which there is a danger of generation undesired current in the logically unstable state to verify the presence of the undesired current generated in the logic circuit as a function of the unstable state duration. Since the verification is based on the length of the unstable state duration at the target node closely related to the presence of the undesired current generated in the logic circuit, the presence of the undesired current generated in the logic circuit is automatically verified with high accuracy. Since the verification based on the unstable state duration is performed only on the target node, the verification is very effective.

Preferably, the logic simulator further comprises means for providing the unstable state duration equivalent to a length of time of the danger of generation of the undesired current in the logic circuit as an undesired current generation critical period, the verifying means receiving the circuit connection data and the undesired current generation critical period for performing the logic simulation on the logic circuit and for determining the unstable state duration for the signal provided from the target node to verify the presence of the undesired current generated in the logic circuit as a function of a comparison result of the unstable state duration with the undesired current generation critical period.

For verification of the length of the unstable state duration of the verifying means, the undesired current generation critical period is provided from the verifying means.

Preferably, the target node is a node that serves as a gate input of a transistor forming the logic circuit and is not directly connected to a power supply voltage.

The node that serves as the gate input of the transistor forming the logic circuit and is not directly connected to the power supply voltage is selected as an undesired current verification target element, to thereby enable the presence of the abnormal current such as the through current in the transistor to be verified.

An object of the present invention is to provide a logic simulator that automatically verifies the presence of an undesired current such as a through current generated in a logic circuit.

BRIEF DESCRIPTION OF THE DRAWINGS

FIG. 8 schematically shows an exemplary logic simulation result list.

DESCRIPTION OF THE PREFERRED EMBODIMENTS

Figure 1:
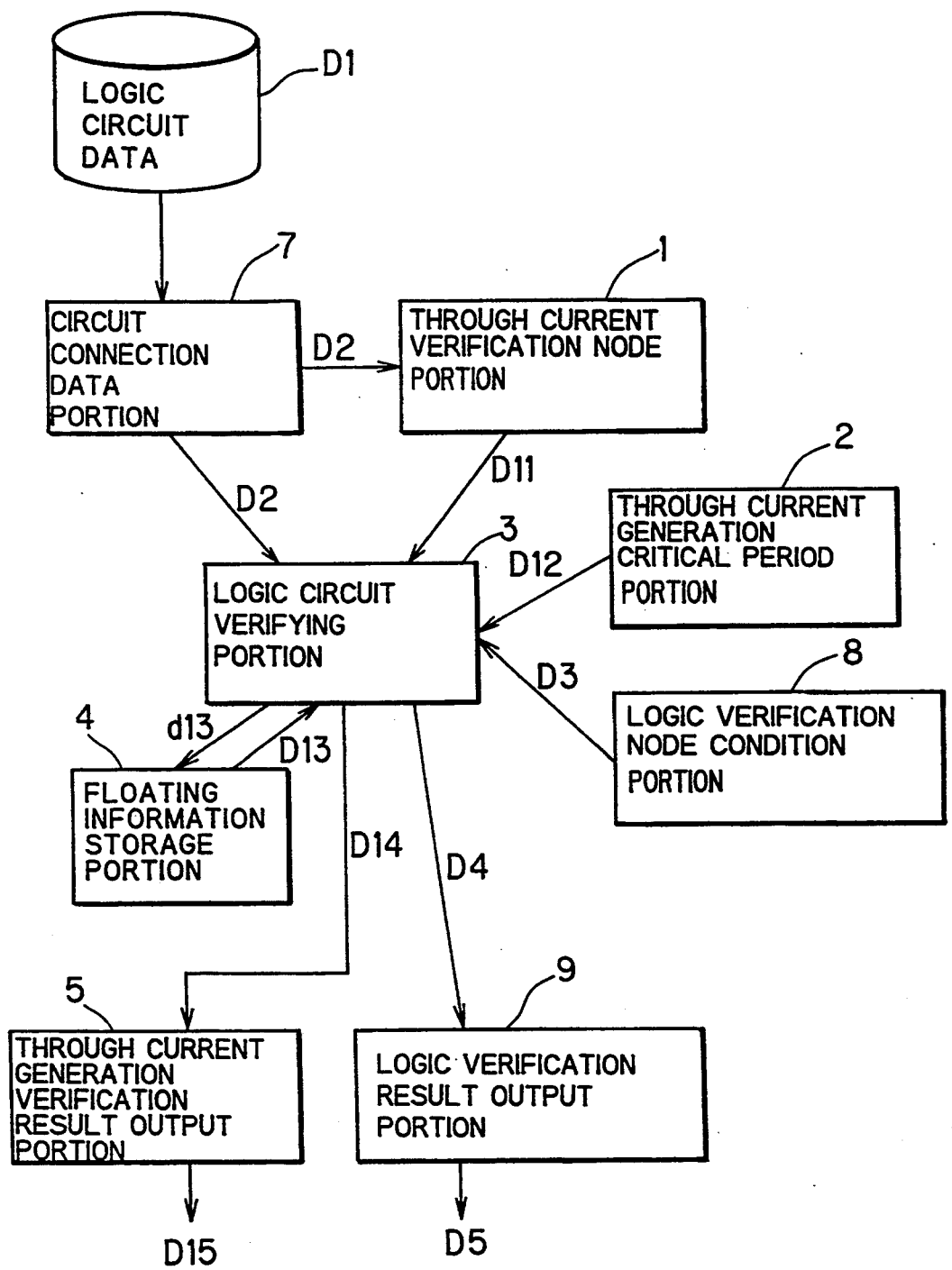
FIG. 1 is a block diagram of a logic simulator of a preferred embodiment according to the present invention.

FIG. 1 is a block diagram of a logic simulator of a preferred embodiment according to the present invention. A circuit connection data portion 7 receives a logic circuit data D1 that is drawing data of a logic circuit to be simulated to extract a circuit connection data D2 specifying the connection of devices forming the logic circuit as a function of the logic circuit data D1. The circuit connection data D2 is outputted to a logic circuit verifying portion 3 and a through current verification node portion 1.

The through current verification node portion 1 extracts a through current verification target node data D11 specifying nodes required to be subjected to the verification of the presence of a floating state among those provided between the devices specified by the circuit connection data D2 for the purpose of verifying the presence of the through current generated. The through current verification target node, data D11 is outputted to the logic circuit verifying portion 3.

A logic verification node condition establishing portion 8 outputs to a logic circuit verifying portion 3 a logic verification node condition data D3 specifying the conditions of nodes to be logically verified among those provided between the devices specified by the circuit connection data D2. A through current generation critical period portion 2 outputs to the logic circuit verifying portion 3 a through current generation critical period D12 that is a gate input floating state duration for which there is a danger of a through current flow in a transistor.

The logic circuit verifying portion 3 carries out a logic simulation as a function of the circuit connection data D2 in the same fashion as the prior art to output to a logic verification result output portion 9 a transition with time in signals (logic verification signals) only provided from the nodes satisfying the logic verification node condition data D3 as a logic simulation result D4.

The logic circuit verifying portion 3 outputs to a floating information storage portion 4 one by one generation and end times of the floating state with respect to signals (through current generation verification signals) provided from the nodes specified by the through current verification target node data D11 as a floating node information d13 as a function of the circuit connection data D2 during the execution of the logic simulation.

On completing the logic simulation, a floating node information group D13 as an aggregate of the floating node informations d13 is accumulated in the floating information storage portion 4. The logic circuit verifying portion 3 compares each floating node information d13 in the floating node information group D13 with the through current generation critical period D12 to carry out a through current generation verification so that the verification result is outputted as a through current generation verification result D14 to a through current generation verification result output portion 5.

The logic verification result output portion 9 outputs a logic simulation result list D5 in which the results are described in a list form in the same fashion as the prior art as a function of the logic simulation result D4.

Figure 6:
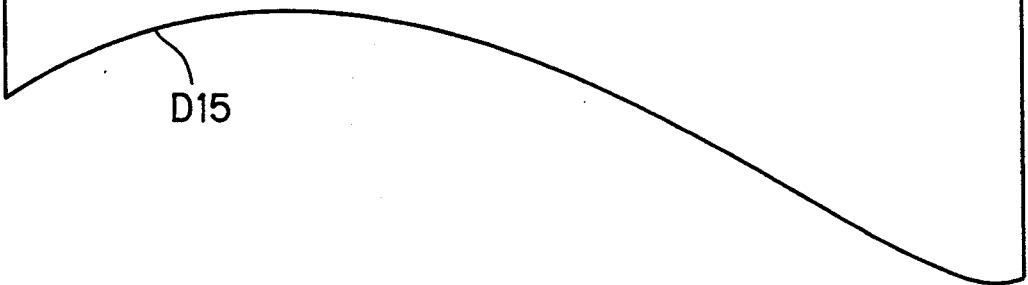
FIG. 6 schematically shows an exemplary through current generation verification result list.
Figure 7:
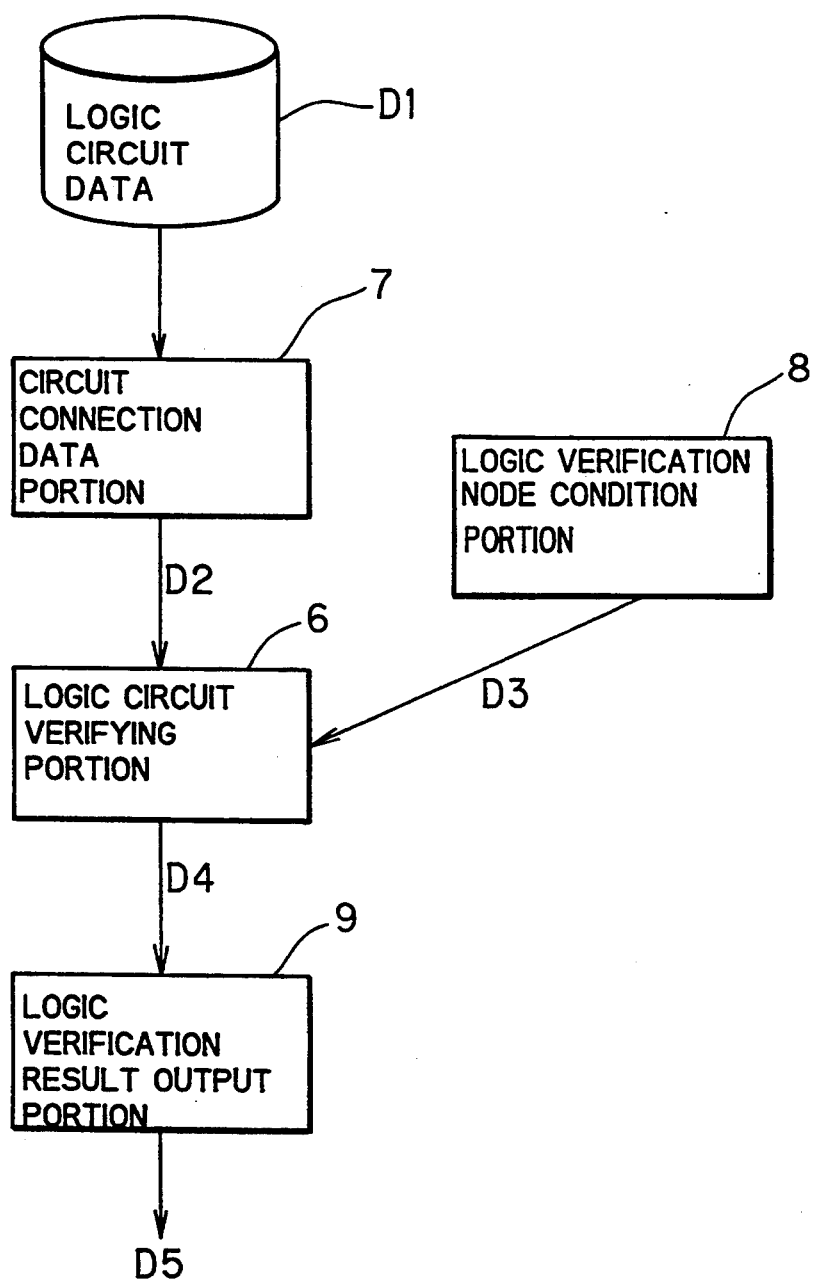
FIG. 7 is a block diagram of a conventional logic simulator.

The through current generation verification result output portion 5 outputs a through current generation verification result list D15 in which the results are described in a list form as shown in FIG. 6 as a function of the through current generation verification result D14. The through current generation verification result list D15 gives a message that a floating period of the through current generation verification signal whose signal name is TBCLOCK is 180 (nsec) (700–520) which exceeds the through current generation critical period D12 of 100 (nsec).

Figure 2:
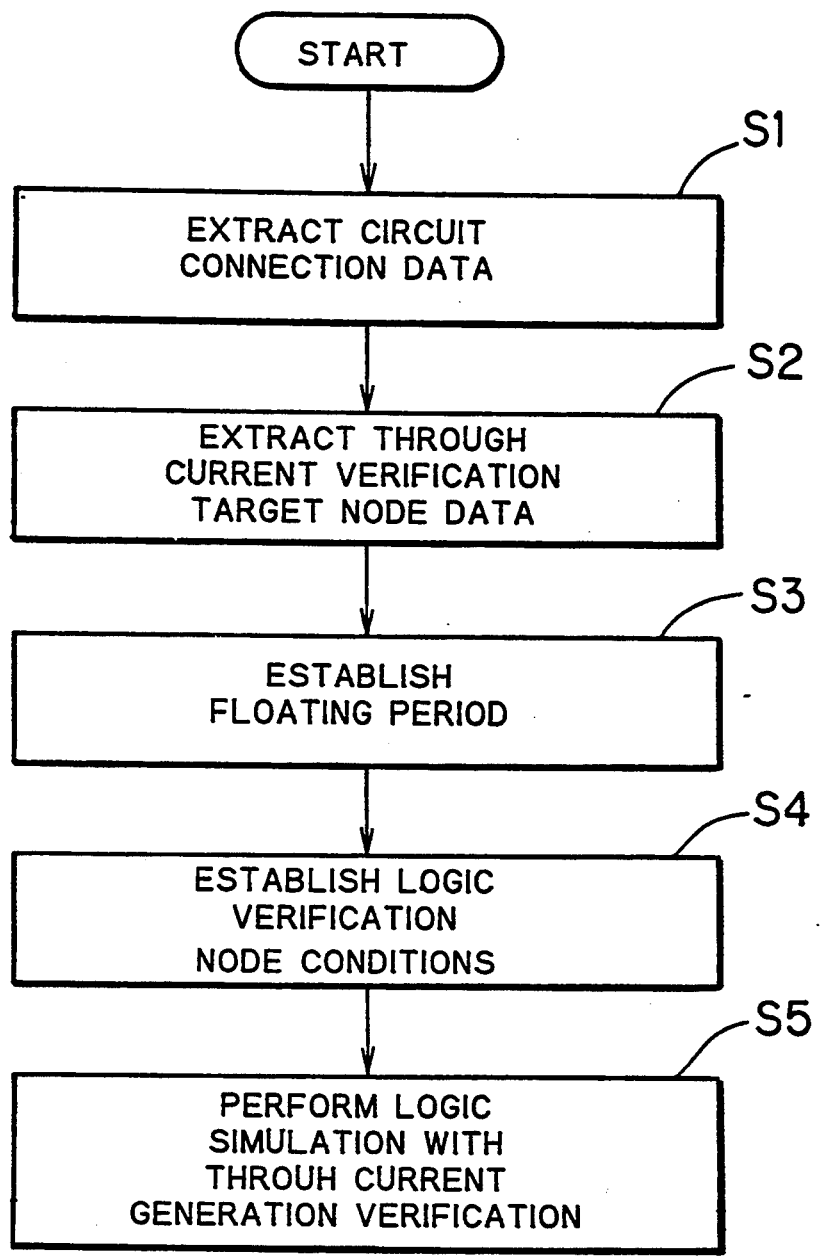
FIGS. 2 and 3 are flow charts showing tile operations of the logic simulator of the preferred embodiment.

FIG. 2 is a flow chart showing the; logic verification and through current generation verification operations of the logic simulator of the preferred embodiment. The operations will be described hereinafter with reference to FIG. 2.

In the step S1, the circuit connection data portion 7 extracts the circuit connection data D2 for logic simulation from the logic circuit data D1 to output the circuit connection data D2 to the through current verification node extracting portion 1 and logic circuit verifying portion 3.

In the step S2, the through current verification node portion 1 extracts the through current verification target node data D11 specifying the nodes to be subjected to the verification of the presence of the through current from the circuit connection data D2 to output the through current verification target node data D11 to the logic circuit verifying portion 3. Description will be given below on the extraction of the through current verification target node data D11 by the through current verification node portion 1.

Figure 4:
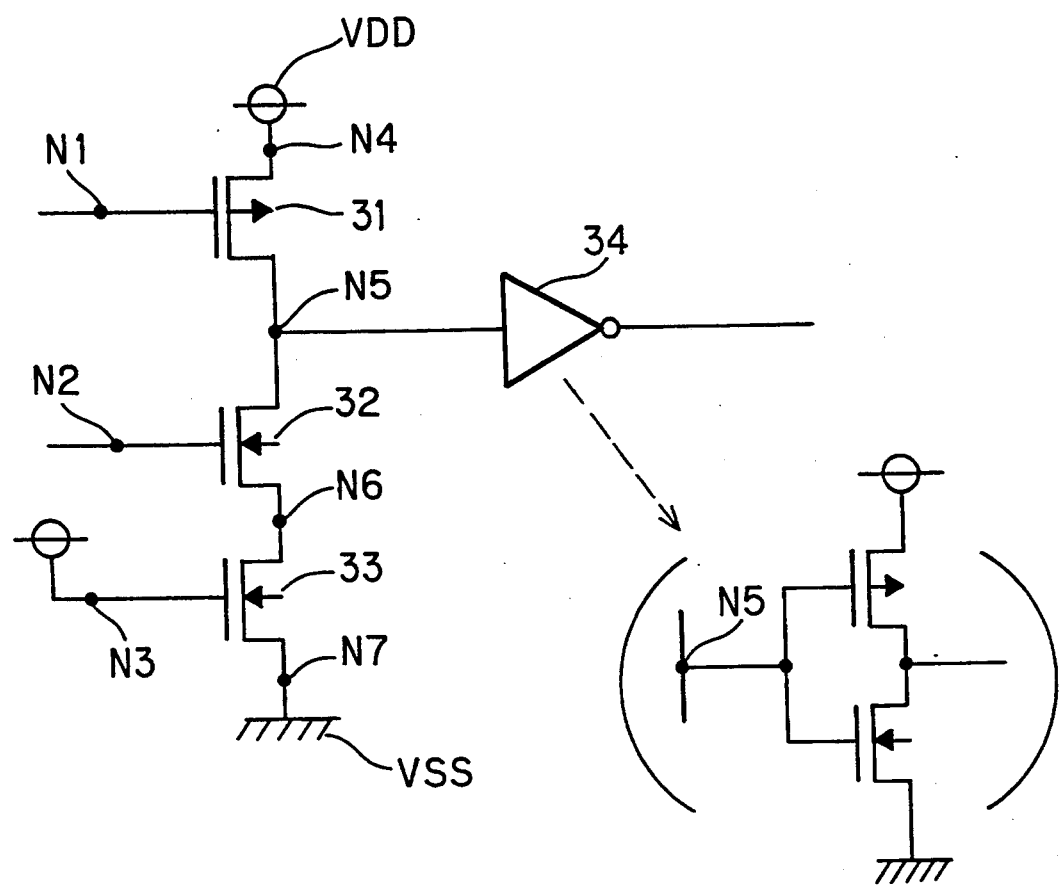
FIG. 4 is a circuit diagram illustrating a through current generation verification node extracting operation.

In a circuit shown in FIG. 4, different signals are provided at nodes N1 to N7 in a signal route between the inputs of transistors 31 to 33 and the input of an inverter 34. Among the nodes N1 to N7, the through current verification nodes are the nodes connected to gate terminals of the transistors (the nodes N1, N2, N3, N5) and connected directly to neither a power supply terminal nor a grounding terminal (the node N1, N2, N5). When the nodes N1, N2 and N5 are in the floating state for more than a predetermined period of time, there is a danger of the through current flow in the transistor having the gate connected to the nodes, and the node data specifying the nodes N1, N2 and N5 are extracted as the through current verification target node data D11.

In the step S3, the through current generation critical period portion 2 establishes the through current generation critical period D12 that is the gate input floating state duration in which there is a danger of the through current flow in the transistor to output the through current generation critical period D12 to the logic circuit verifying portion 3.

Figure 5:
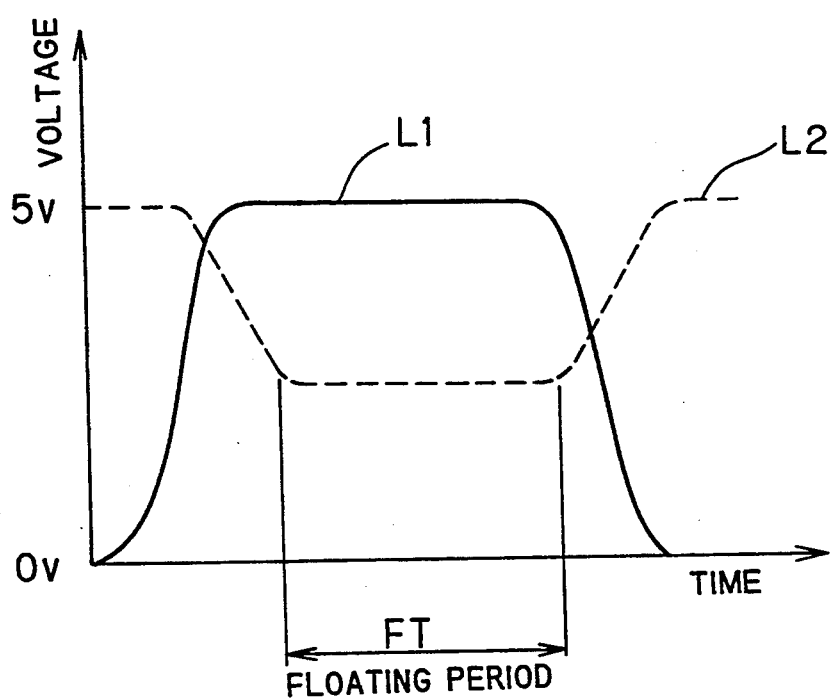
FIG. 5 is a graph showing a floating period of a P-channel transistor.

FIG. 5 is a graph showing a floating period FT of a P-channel transistor. In the graph, L1 represents a gate input signal, and L2 represents a drain output signal responsive to the gate input signal L1. When the gate input signal L1 is 5 V, the P-channel transistor turns off, so that the drain output signal L2 thereof enters the floating state.

In the step S4, the logic verification node condition portion 8 outputs the logic verification node condition data D3 specifying the conditions of the nodes to be logically verified to the logic circuit verifying portion 3.

In the step S5, the logic circuit verifying portion 3 carries out the logic simulation with the through current generation verification as a function of the circuit connection data D2, through current verification target node data D11, through current generation critical period D12 and logic verification node condition data D3 provided in the steps S1 to S4.

Figure 3:
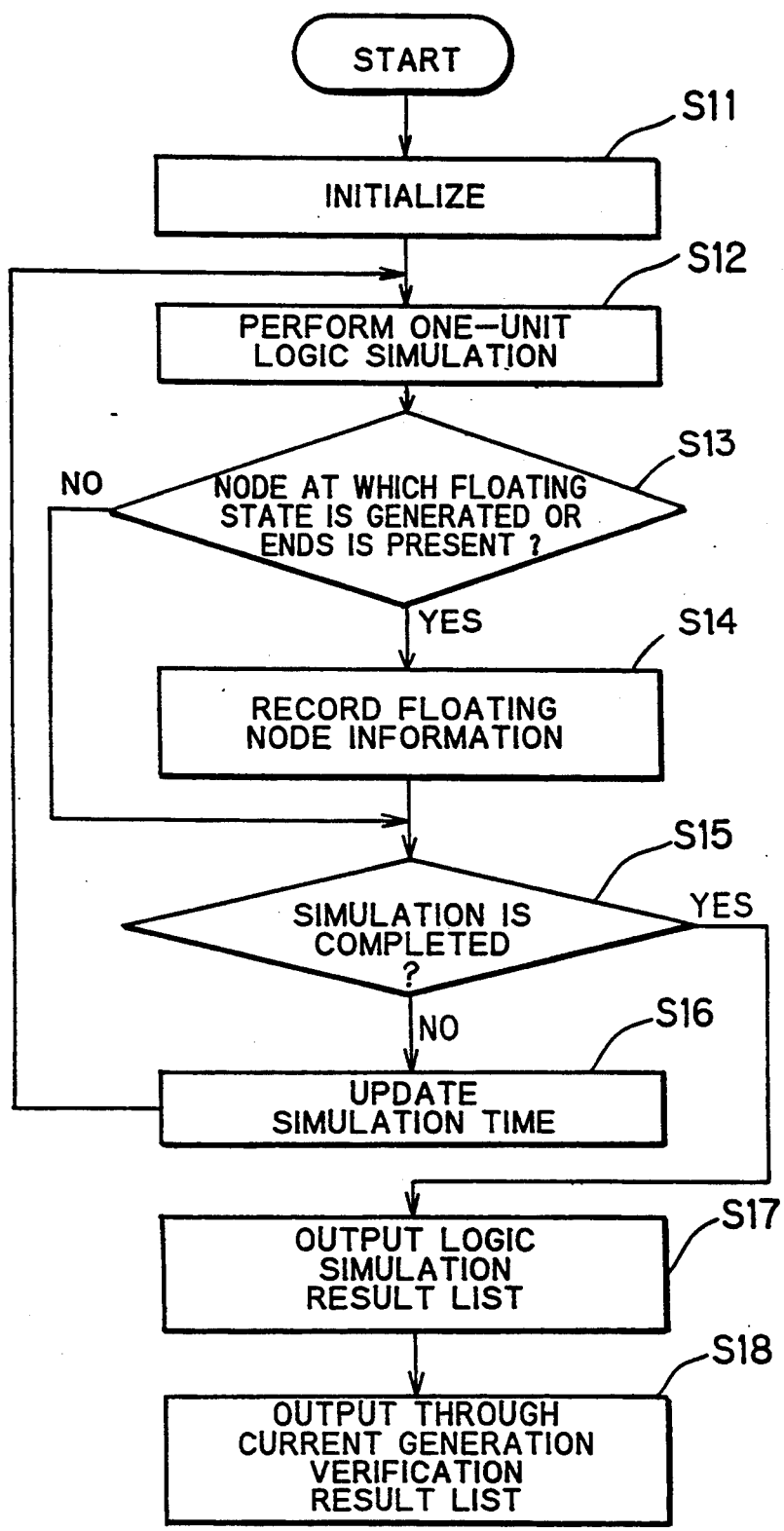

FIG. 3 is a flow chart showing the logic simulation with the through current generation verification by the logic circuit verifying portion 3 in corresponding relation to the operation of the step S5 of FIG. 2. The operation will be described below with reference to FIG. 3.

Initialization such as establishment of a start simulation time is performed in the step S11. Signal levels provided from all nodes of the logic circuit to be simulated at a current simulation time are simulated in the step S12. This operation is referred to as a "one-unit logic simulation" hereinafter.

The presence of the nodes at which the generation or end of the floating state is detected through the one-unit logic simulation of the step S12 (hereinafter referred to as "floating state displacement nodes") is checked in the step S13. The process proceeds to the step S14 when a floating state displacement node is present, and the process proceeds to the step S15 when it is absent. It should be noted that the generation of the floating state is a change of the node which is not in the floating state into the floating state, and the end of the floating state is a change of the node which is in the floating state into the non-floating state.

In the step S14, the data of the floating state displacement nodes detected in the step S13 are recorded in the floating information storage portion 4. The recording operation will be described below.

It is checked whether or not the floating state displacement node is the through current verification node specified by the through current verification target node data D11, that is, whether or not the floating state displacement node is the node connected to the gate terminal of the transistor and connected directly to neither the power supply terminal nor the grounding terminal. When the floating state displacement node is the through current verification node, the floating node information d13 having a set of information including its node name, the current simulation time and the information of the generation/end of the floating state is recorded in the floating information storage portion 4. When the floating state displacement node is not the through current verification node, no processing is performed.

On completing the step S14, the process then proceeds to the step S15. It is checked in the step S15 whether or not the logic simulation is completed. When it is completed, the process proceeds to the step S17 for the list output processing of the logic simulation result. When it is not completed, the process proceeds to the step S16.

In the step S16, the simulation time is advanced to thereby be updated, and the process returns to the step S12. Then the one-unit logic simulation at the updated simulation time, the check of the floating state displacement node and the recording of the floating node information are carried out in the steps S12 to S14. The processings in the steps S16 and S11 to S14 are repeated until the completion of the simulation is confirmed in the step S15.

When the completion of the simulation is confirmed in the step S15, the process proceeds to the step S17. The transition with time in the logic verification signals provided from the nodes satisfying the conditions specified by the logic verification node condition data D3 is outputted as the logic simulation result D4 to the logic verification result output portion 9 in the step S17. The logic verification result output portion 9 outputs the logic simulation result list D5 in which the results are described in the list form in the same fashion as the prior art as a function of the logic simulation result D4.

In the step S18, each floating node information d13 in the floating node information group D13 recorded in the floating information storage portion 4 is compared with the through current generation critical period D12. It is verified whether or not the duration of the floating state generated at the respective through current verification node which is recorded as the floating node information d13 exceeds the through current generation critical period. The result is outputted to the through current generation verification result output portion 5 as the through current generation verification result D14. The through current generation verification result output portion 5 outputs the through current generation verification result list D15 as shown in FIG. 6.

As above described, the logic simulator of the preferred embodiment carries out the automatic through current generation verification as well as the normal logic simulation. When the floating state causing the abnormal current such as the through current is generated at the through current verification nodes, a warning is given in the form of the through current generation verification result list D15. Since the through current verification nodes are limited in accordance with the aforesaid conditions, a required memory capacitance of the floating information storage portion 4 is not so large.

For the through current generation verification only, the logic verification node condition portion 8 and the logic verification result output portion 9 need not be provided.

For expecting the generation of the abnormal current such as the through current, the floating state of the nodes is verified in this preferred embodiment. However, the indeterminate level of the nodes may be verified for this purpose. In this case, a gate input indeterminate level duration in which there is a danger of the through current flow in the transistor should be applied as a second through current generation critical period to the logic circuit verifying portion 3 in addition to the arrangement of this preferred embodiment, and the logic circuit verifying portion 3 should be adapted to verify the indeterminate level in the same fashion as the verification of the floating state. Since the through current verification nodes are intactly applied to the nodes to be subjected to the verification of the indeterminate level, the through current verification target node data D11 outputted from the through current verification node portion 1 may be employed. For expecting the generation of the abnormal current such as the through current, only the indeterminate level of the nodes may be verified without the verification of the floating state of the nodes.

In this preferred embodiment, the presence of the through current generated is verified in batch operation after the completion of the logic simulation to output the through current generation verification result list. Alternatively, each time the completion of the floating state of the through current generation verification nodes is confirmed, it may be judged whether or not the floating period is within the range of the through current generation critical period to output the through current generation verification result one by one. The same is true for the verification of the indeterminate level of the nodes.

While the invention has been shown and described in detail, the foregoing description is in all aspects illustrative and not restrictive. It is therefore understood that numerous modifications and variations can be devised without departing from the scope of the invention.

I claim:

1. A logic simulator for detecting the presence of an undesired current generated in a predetermined logic circuit, said logic simulator comprising:

circuit connection data means for providing circuit connection data specifying a connection of devices which form said logic circuit;

means for receiving said circuit connection data and identifying a target node of said logic circuit at which there is a danger of generation of undesired current in said logic circuit in a logically unstable state out of nodes provided between said devices which form said logic circuit; and verifying means for receiving said circuit connection data and performing a logic simulation on said logic circuit, and for determining an unstable state duration during which a signal provided from said target node has an unstable logical level to verify the presence of said undesired current generated in said logic circuit as a function of said unstable state duration.

2. The logic simulator of claim 1, further comprising:

means for providing said unstable duration as a length of time that said danger of generation of said undesired current in said logic circuit exists as an undesired current generation critical period, said verifying means receiving said circuit connection data and said undesired current generation critical period for performing said logic simulation on said logic circuit and for determining said unstable state duration for a signal provided from said target node to verify the presence of said undesired current generated in said logic circuit as a function of a comparison result of said unstable state duration with said undesired current generation critical period.

3. The logic simulator of claim 2, wherein said target node is a node that serves as a gate input of a transistor of said logic circuit and is not directly connected to a power supply voltage.

4. The logic simulator of claim 3, further comprising output means for outputting a message including at least a warning of the generation of said undesired current, a function of a verification result of said verifying means when said unstable state duration exceeds said undesired current generation critical period.

5. The logic simulator of claim 4, wherein said verifying means includes information storage means permitted to record therein an identity of said target node and said unstable state duration thereof.

6. The logic simulator of claim 5, wherein said unstable state duration is obtained by subtracting an unstable state generation time of said target node from an unstable state finish time thereof.

7. The logic simulator of claim 6, wherein said circuit connection data means extracts said circuit connection data from drawing data specifying said logic circuit to provide said circuit connection data.

8. The logic simulator of claim 7, further comprising node condition means for determining a logic verification node condition which represents a node condition of said logic circuit required to be logically verified, said verifying means receiving said logic verification node condition for performing a logic verification on a node satisfying said logic verification node condition as well as the verification of the presence of said undesired current generated in said logic circuit.

9. The logic simulator of claim 8, further comprising logic verification result output means for outputting transitions over time in a signal level provided from said node satisfying said logic verification node condition as a function of a logic verification result of said verifying means.

10. The logic simulator of claim 9, wherein said undesired current generation verification of said verifying means is performed in batch operation after completion of logic simulation.

11. The logic simulator of claim 9, wherein said undesired current generation verification of said verifying means is performed each time said target node enters said logically unstable state.

12. The logic simulator of claim 9, wherein said logically unstable state of said target node is at least one of the states in which said target node is in a floating state and in which it has an indeterminate level.

13. The logic simulator of claim 12, wherein said undesired current generation critical period is a period of time that a floating state duration of said target node serving as said gate input of said transistor is equivalent to a length of time for which there is a danger of a through current flow in said transistor.

14. The logic simulator of claim 12, wherein said undesired current generation critical period is a period of time that a duration of said indeterminate level of said target node serving as said gate input of said transistor is equivalent to a length of time for which there is a danger of a through current flow in said transistor.

* * * * *